(12) United States Patent
Shin et al.

(10) Patent No.: US 12,543,375 B2
(45) Date of Patent: Feb. 3, 2026

(54) LIGHT EMITTING DISPLAY APPARATUS

(71) Applicant: LG Display Co., Ltd., Seoul (KR)

(72) Inventors: Minjae Shin, Paju-si (KR); Yuseok Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 513 days.

(21) Appl. No.: 18/146,964

(22) Filed: Dec. 27, 2022

(65) Prior Publication Data

US 2023/0215878 A1      Jul. 6, 2023

(30) Foreign Application Priority Data

Dec. 31, 2021 (KR) .......................... 10-2021-0194752

(51) Int. Cl.
*H10D 86/60*      (2025.01)
*H01L 23/00*      (2006.01)
(Continued)

(52) U.S. Cl.
CPC ............. *H10D 86/60* (2025.01); *H01L 24/05* (2013.01); *H01L 24/48* (2013.01); *H10D 86/441* (2025.01);
(Continued)

(58) Field of Classification Search
CPC ...... H10D 86/60; H10D 86/441; H01L 24/48; H01L 24/05; H01L 24/49; H01L 25/167; H01L 24/73; H01L 24/32; H01L 25/50; H01L 25/18; H01L 25/0753; H01L 2224/73265; H01L 2224/05572;
(Continued)

(56) References Cited

U.S. PATENT DOCUMENTS 11,263,978 B2 *   3/2022   Jo ........................... H10K 59/88
2017/0047547 A1 *   2/2017   Son ........................ H10K 50/844
(Continued)

FOREIGN PATENT DOCUMENTS

CN      113220161 A      8/2021
KR      101058094 B1     8/2011
(Continued)

*Primary Examiner* — Mouloucoulaye Inoussa
(74) *Attorney, Agent, or Firm* — Seed Intellectual Property Law Group LLP

(57) ABSTRACT

A light emitting display apparatus includes a first substrate including pixels and signal lines arranged in a first direction and a second substrate disposed on a rear surface of the first substrate, wherein a routing portion including routing lines is provided in a first lateral surface of the first substrate and a second lateral surface of the second substrate. In the first substrate, a first pad portion adjacent to the first lateral surface includes first pads connected to the signal lines and the routing lines, a first secondary pad provided between the first pads, and a first connection line provided to overlap the first pads and the first secondary pad. In the second substrate, a second pad portion adjacent to the second lateral surface includes second pads connected to the routing lines, a second secondary pad provided between the second pads, and a second connection line provided to overlap the second pads and the second secondary pad. The routing portion includes a secondary routing line connecting the first secondary pad to the second secondary pad.

14 Claims, 10 Drawing Sheets

(51) Int. Cl.
*H01L 25/16* (2023.01)
*H10D 86/40* (2025.01)

(52) U.S. Cl.
CPC .............. *H01L 24/32* (2013.01); *H01L 24/49* (2013.01); *H01L 24/73* (2013.01); *H01L 25/167* (2013.01); *H01L 2224/05572* (2013.01); *H01L 2224/32145* (2013.01); *H01L 2224/48145* (2013.01); *H01L 2224/49175* (2013.01); *H01L 2224/4918* (2013.01); *H01L 2224/73265* (2013.01)

(58) Field of Classification Search
CPC . H01L 2224/32145; H01L 2224/49175; H01L 2224/48145; H01L 2224/4918; H10K 59/131; H10K 50/19; H10K 50/11; H10K 50/17; H10K 50/12; H10K 59/18; H10K 59/1315; H10K 59/8731; H10K 50/155; H10K 59/88; H10K 50/156; H10K 77/10; H10K 2101/40; G02F 1/1345; G02F 1/13336; G09F 9/302; H10H 29/142; H10H 29/10; H10H 20/853; H10H 20/857; G09G 3/3208; G09G 2300/026; G09G 2300/0426; Y02E 10/549
See application file for complete search history.

(56) References Cited

U.S. PATENT DOCUMENTS

| | | | |
|---|---|---|---|
| 2018/0059449 | A1 | 3/2018 | Kim |
| 2020/0051966 | A1* | 2/2020 | Lee ........................ H10K 77/10 |
| 2021/0202630 | A1* | 7/2021 | Jeon ...................... H10K 50/844 |
| 2021/0202675 | A1* | 7/2021 | Jang ...................... H10K 59/131 |
| 2021/0202676 | A1* | 7/2021 | Jeong ..................... H10K 59/10 |
| 2021/0202686 | A1* | 7/2021 | Jeon ....................... H10K 50/19 |
| 2021/0202906 | A1* | 7/2021 | Kim ..................... H10K 59/873 |
| 2021/0202907 | A1* | 7/2021 | Lee ...................... H10K 59/121 |
| 2021/0366378 | A1* | 11/2021 | Zhao ........................ G09F 9/302 |
| 2022/0007504 | A1* | 1/2022 | Chen .................... H10K 59/131 |
| 2022/0238465 | A1* | 7/2022 | Hosaka ............... H01L 25/0657 |

FOREIGN PATENT DOCUMENTS

| | | |
|---|---|---|
| KR | 1020180023106 A | 3/2018 |
| KR | 102211928 B1 | 2/2021 |
| KR | 20210086291 A | 7/2021 |

* cited by examiner

LIGHT EMITTING DISPLAY APPARATUS

CROSS-REFERENCE TO RELATED APPLICATIONS

This application claims the benefit of the Korean Patent Application No. 10-2021-0194752 filed on Dec. 31, 2021, which is hereby incorporated by reference as if fully set forth herein.

BACKGROUND

Technical Field

The present disclosure relates to a light emitting display apparatus.

Description of the Related Art

A non-display area, which does not display an image, is provided at a border or an edge of a light emitting display panel.

In order to increase the immersion of a user, a width of the non-display area has been progressively reduced, and light emitting display panels including no non-display area have been proposed recently.

In order to manufacture light emitting display panels including no non-display area, routing lines for electrically connecting a first substrate, displaying an image, to a second substrate coupled to the first substrate and equipped with various drivers should be provided on lateral surfaces of the first substrate and the second substrate.

BRIEF SUMMARY

The inventors have realized that a process of forming routing lines in a light emitting display panel is performed at a latter part of a process of manufacturing the light emitting display panel. Therefore, when an error occurs due to the routing lines, the light emitting display panel should be discarded, and due to this, damage may increase.

Accordingly, the present disclosure is directed to providing a light emitting display apparatus that substantially obviates one or more problems due to limitations and disadvantages of the related art.

An aspect of the present disclosure is directed to providing a light emitting display apparatus which includes a secondary pad and a secondary routing line for replacing a damaged routing line.

Additional advantages and features of the disclosure will be set forth in part in the description which follows and in part will become apparent to those having ordinary skill in the art upon examination of the following or may be learned from practice of the disclosure. The technical benefits and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a first substrate including pixels and signal lines arranged in a first direction and a second substrate disposed on a rear surface of the first substrate, wherein a routing portion including routing lines is provided in a first lateral surface of the first substrate and a second lateral surface of the second substrate. In the first substrate, a first pad portion adjacent to the first lateral surface includes first pads connected to the signal lines and the routing lines, a first secondary pad provided between the first pads, and a first connection line provided to overlap the first pads and the first secondary pad. In the second substrate, a second pad portion adjacent to the second lateral surface includes second pads connected to the routing lines, a second secondary pad provided between the second pads, and a second connection line provided to overlap the second pads and the second secondary pad. The routing portion includes a secondary routing line connecting the first secondary pad to the second secondary pad.

It is to be understood that both the foregoing general description and the following detailed description of the present disclosure are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
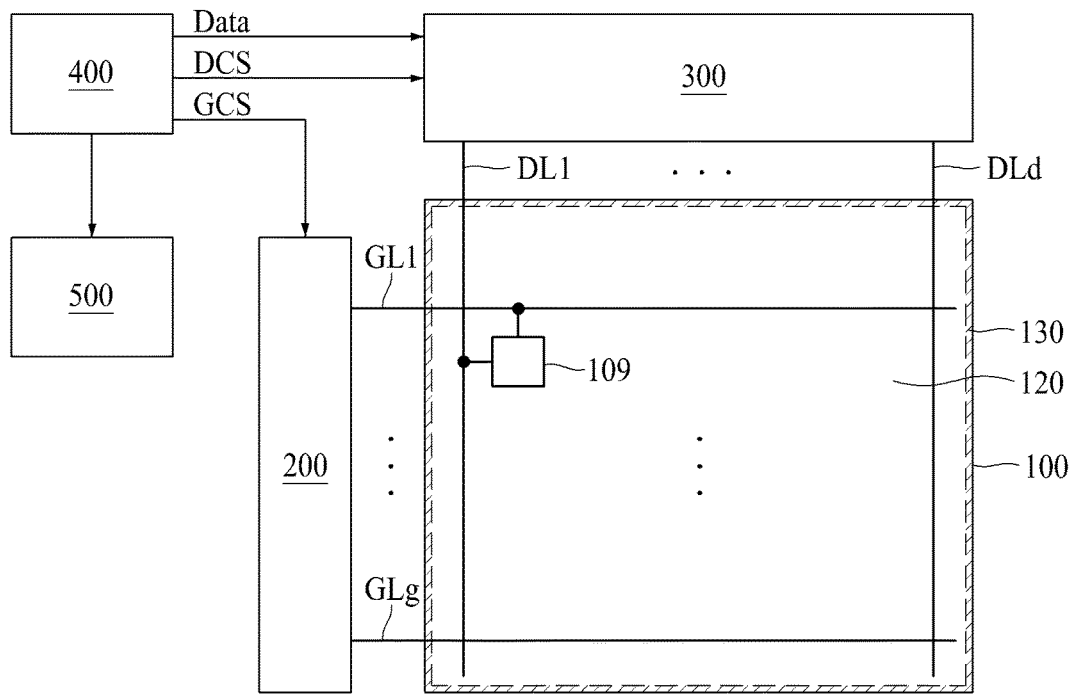
FIG. 1 is an example diagram illustrating a configuration of a light emitting display apparatus according to the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer the element or layer may not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
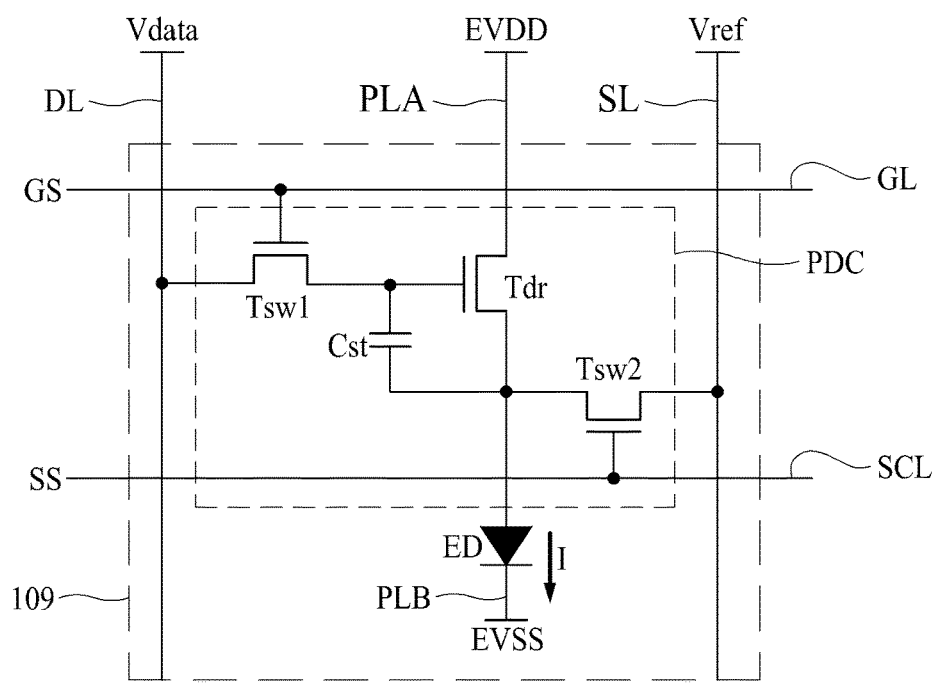
FIG. 2 is an example diagram illustrating a structure of a pixel applied to a light emitting display apparatus according to the present disclosure.

FIG. 1 is an example diagram illustrating a configuration of a light emitting display apparatus according to the present disclosure, and FIG. 2 is an example diagram illustrating a structure of a pixel applied to a light emitting display apparatus according to the present disclosure.

The light emitting display apparatus according to the present disclosure may configure various electronic devices. The electronic devices may include, for example, smartphones, tablet personal computers (PCs), televisions (TVs), and monitors.

The light emitting display apparatus according to the present disclosure, as illustrated in FIG. 1, may include a light emitting display panel 100 which includes a display area 120 displaying an image and a non-display area 130 provided outside the display area 120, a gate driver 200 which supplies a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply 500 which supplies power to the controller, the gate driver, the data driver, and the light emitting display panel. Particularly, in the light emitting display apparatus according to the present disclosure, stages included in the gate driver 200 may be provided in the display area 120, and the gate lines GL1 to GLg connected to the stages may be provided in the light emitting display panel 100.

First, the light emitting display panel 100 may include the display area 120 and the non-display area 130.

A plurality of pixels 109 displaying an image may be provided in the display area 120, and the non-display area 130 may surround the display area 120.

In the present disclosure, because the stages included in the gate driver 200 are provided in the display area 120, a width of the non-display area 130 may be minimized or reduced.

Particularly, in the present disclosure, the non-display area 130 may be omitted. That is, the display area 120 may be provided in a whole surface of a front surface of the light emitting display panel 100. In this case, as described above, because the gate driver 200 connected to the gate lines are provided in the display area, a non-display area for the gate driver 200 may be omitted. Also, for example, ends of the data lines connected to the data driver 300 may extend to an upper end of the light emitting display panel 100 illustrated in FIG. 1 and a rear surface of the light emitting display panel through a lateral surface connected to the upper end and may be connected to the data driver 300 at the rear surface of the light emitting display panel. Therefore, a non-display area for the gate driver 200 and the data driver 300 and pads for connecting the gate lines and the data lines to the gate driver 200 and the data driver 300 may not be provided in the front surface of the light emitting display panel 100. Accordingly, in the present disclosure, the non-display area 130 may be omitted.

However, the present disclosure is not limited thereto. Accordingly, the non-display area 130 for arranging various lines and pads may be provided outside the display area 120.

The gate lines GL1 to GLg, the data lines DL1 to DLd, and the pixels 109 may be provided in the display area 120. Also, the stages configuring the gate driver 200 may be provided in the display area 120. Accordingly, the display area 120 may display an image. Here, g and d may each be a natural number.

The pixel 109 included in the light emitting display panel 100, as illustrated in FIG. 2, may include an emission area which includes a pixel driving circuit PDC, including a switching transistor Tsw1, a storage capacitor Cst, a driving transistor Tdr, and a sensing transistor Tsw2, and a light emitting device ED.

A first terminal of the driving transistor Tdr may be connected to a high voltage supply line PLA through which a high voltage EVDD is supplied, and a second terminal of the driving transistor Tdr may be connected to the light emitting device ED. An anode of the light emitting device ED may be connected to the second terminal of the driving transistor Tdr, and a cathode of the light emitting device ED may be connected to a low voltage supply line PLB through which a low voltage EVSS is supplied.

A first terminal of the switching transistor Tsw1 may be connected to the data line DL, a second terminal of the switching transistor Tsw1 may be connected to a gate of the driving transistor Tdr, and a gate of the switching transistor Tsw1 may be connected to a gate line GL.

A data voltage Vdata may be supplied to a data line DL, and a gate signal GS may be supplied to the gate line GL.

The sensing transistor Tsw2 may be provided for measuring a threshold voltage or mobility of the driving transistor. A first terminal of the sensing transistor Tsw2 may be connected to a second terminal of the driving transistor Tdr and the light emitting device ED, a second terminal of the sensing transistor Tsw2 may be connected to a reference voltage line SL through which a reference voltage Vref is supplied, and a gate of the sensing transistor Tsw2 may be connected to a sensing control line SCL through which a sensing control signal SS is supplied.

A structure of the pixel 109 included in the light emitting display panel 100 is not limited to a structure illustrated in FIG. 2. Accordingly, a structure of the pixel 109 may be changed to various shapes.

An insulation layer and various electrodes configuring the pixels 109 may be provided on a base substrate (hereinafter simply referred to as a substrate) such as a glass substrate or a film. That is, the light emitting display panel 100 may include a substrate, a plurality of insulation layers provided on the substrate, and a plurality of electrodes provided on the substrate.

The data driver 300 may supply data voltages to the data lines.

The controller 400 may realign input video data transferred from an external system by using a timing synchronization signal transferred from the external system and may generate a data control signal DCS which is to be supplied to the data driver 300 and a gate control signal GCS which is to be supplied to the gate driver 200.

To this end, the controller 400 may include a data aligner which realigns input video data to generate image data Data and supplies the image data Data to the data driver 300, a control signal generator which generates the gate control signal GCS and the data control signal DCS by using the timing synchronization signal, an input unit or input circuit which receives the timing synchronization signal and the input video data transferred from the external system and respectively transfers the timing synchronization signal and the input video data to the control signal generator and the data aligner, and an output unit or output circuit which supplies the data driver 300 with the image data Data generated by the data aligner and the data control signal DCS generated by the control signal generator and supplies the gate driver 200 with the gate control signal GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In this case, the image information may include input video information.

The power supply 500 may generate various powers and may supply the generated powers to the controller 400, the gate driver 200, the data driver 300, and the light emitting display panel 100.

The gate driver 200 may supply gate pulses to the gate lines GL1 to GLg. When the gate pulse generated by the gate driver 200 is supplied to the gate of the switching transistor Tsw1 included in the pixel 109, the switching transistor Tsw1 may be turned on. When the switching transistor Tsw1 is turned on, a data voltage supplied through a data line may be supplied to the pixel 109. When a gate-off signal generated by the gate driver 200 is supplied to the gate of the switching transistor Tsw1, the switching transistor Tsw1 may be turned off. When the switching transistor Tsw1 is turned off, a data voltage may not be supplied to the pixel 109 any longer. The gate signal GS supplied to the gate line GL may include the gate pulse and the gate-off signal.

The gate driver 200 may include a plurality of stages, and the stages may be connected to the gate lines GL1 to GLg.

The stages may be included in the light emitting display panel 100, and particularly, may be provided in the display area 120.

Figure 3:
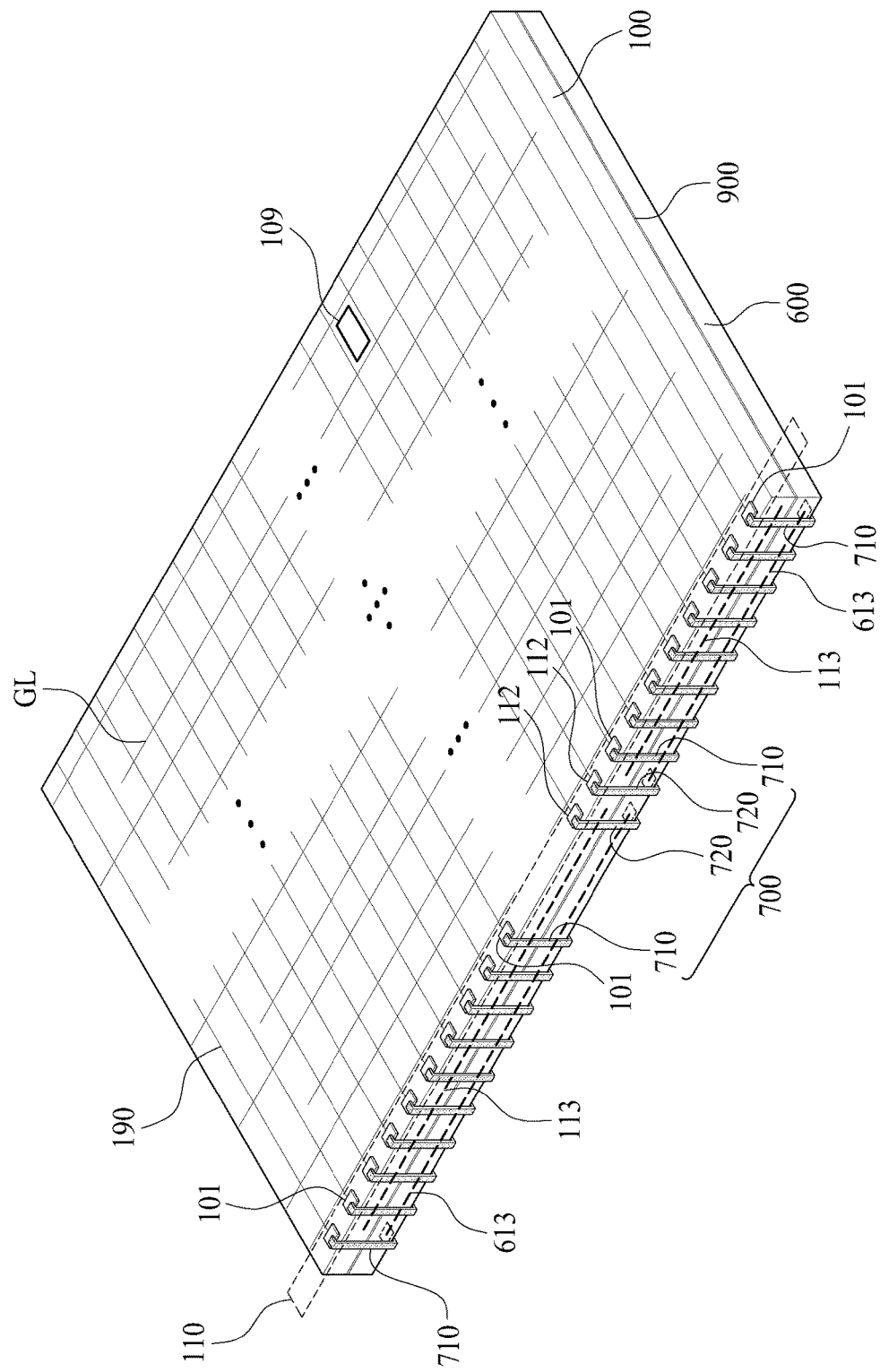
FIG. 3 is a perspective view illustrating a front surface of a light emitting display apparatus according to the present disclosure.
Figure 4:
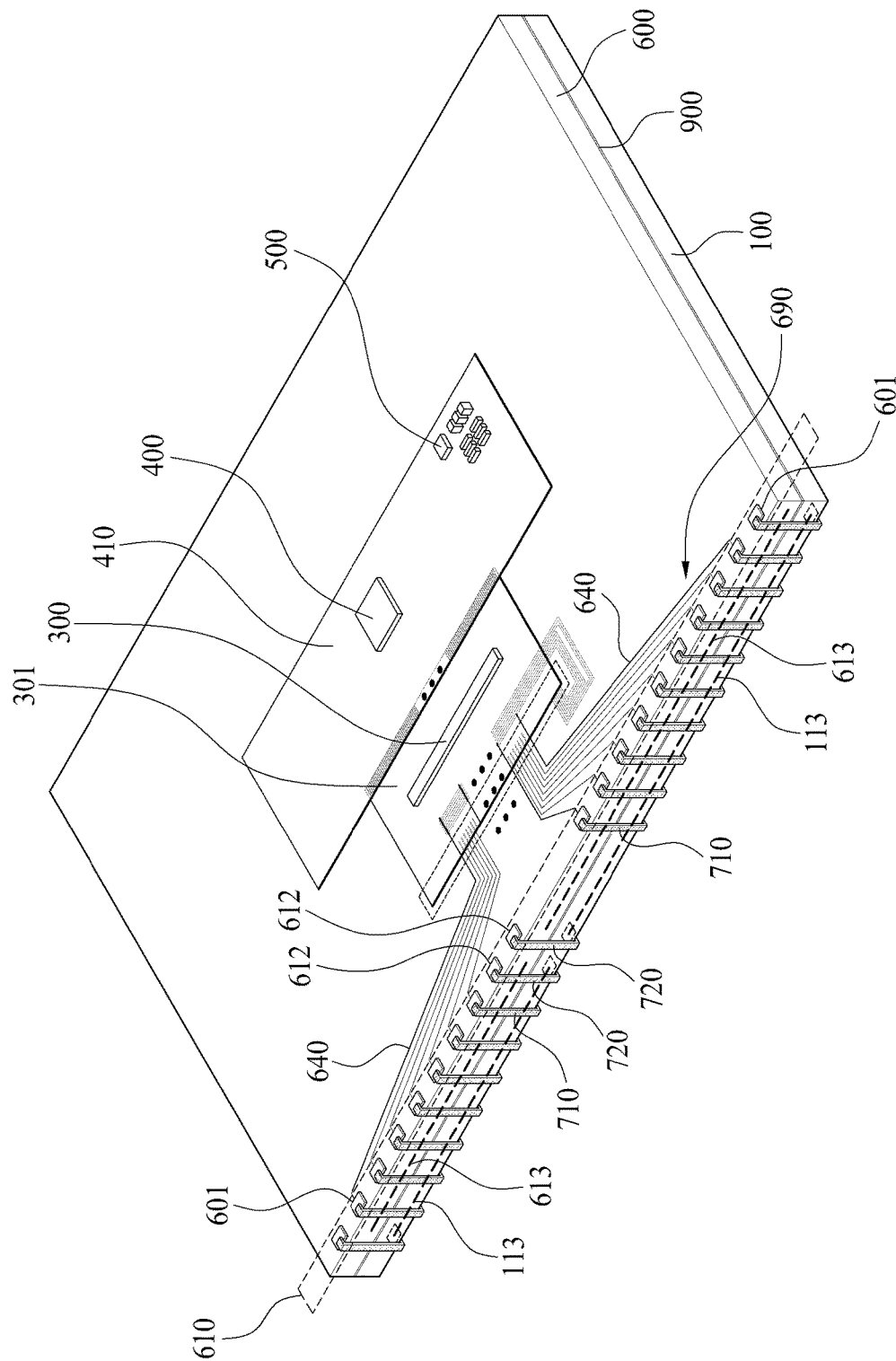
FIG. 4 is a perspective view illustrating a rear surface of a light emitting display apparatus according to the present disclosure.
Figure 5:
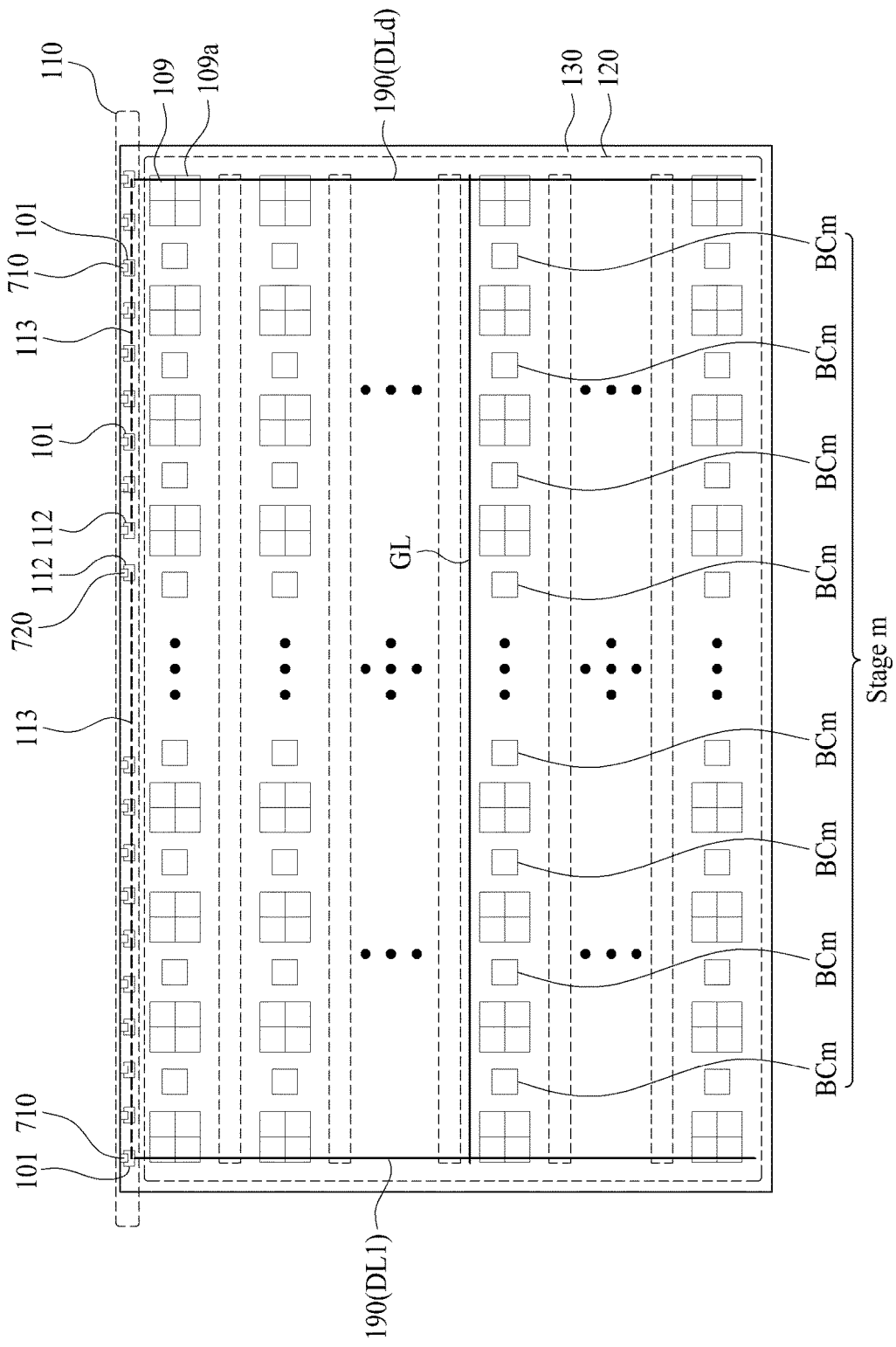
FIG. 5 is an example diagram illustrating a front surface of a light emitting display apparatus according to the present disclosure.

FIG. 3 is a perspective view illustrating a front surface of a light emitting display apparatus according to the present disclosure, FIG. 4 is a perspective view illustrating a rear surface of a light emitting display apparatus according to the present disclosure, and FIG. 5 is an example diagram illustrating a front surface of a light emitting display apparatus according to the present disclosure.

The light emitting display apparatus according to the present disclosure may include a first substrate 100, including signal lines 190 arranged in a first direction, and a second substrate 600 which is disposed on a rear surface of the first substrate 100. The first substrate 100 may be bonded to the second substrate 600 by a coupling member 900.

The first substrate 100 may be the light emitting display panel 100 described above with reference to FIGS. 1 and 2. In the following description, therefore, reference numeral "100" assigned to the light emitting display panel may be used as a reference numeral of the first substrate.

The signal lines 190 may include data lines DL1 to DLd which transfer data voltages to the pixels 109, power lines which transfer driving voltages to the pixels 109, gate clock lines which transfer gate clocks to a gate driver 200, and gate power lines which transfer gate driving voltages to the gate driver 200.

The power lines may include a high voltage supply line PLA and a low voltage supply line PLB illustrated in FIGS. 1 and 2.

First, a routing portion 700 including a plurality of routing lines 710 may be provided on a 1-1$^{th}$ lateral surface of the first substrate 100 and a 2-1$^{th}$ lateral surface of the second substrate 200. These can be referred to as a first and second lateral surface, respectively.

Therefore, in FIGS. 3 and 4, the 1-1$^{th}$ lateral surface and the 2-1$^{th}$ lateral surface may denote lateral surfaces where the routing portion 700 is provided.

In the first substrate 100, a first pad portion 110 adjacent to the 1-1$^{th}$ lateral surface may include a plurality of first pads 101 which are connected to the signal lines 190 and the routing lines 710, at least one first secondary pad 112 which is provided between the first pads 101, and at least one first connection line 113 which is provided to overlap the first pads 101 and the at least one first secondary pad 112.

The first pad portion 110 may include the first pads 101, a second secondary pad 112, and the first connection line 113.

For example, in the first substrate 100 illustrated in FIGS. 3 and 5, two first connection lines 113 may be provided, and the first secondary pad 112 may be provided at a first lateral end of each of the two first connection lines 113 to overlap the first connection line 113.

The number of first connection lines 113 may be variously set based on a size of the first substrate 100, the number of signal lines 190, and a defect rate of the routing lines 710.

The first secondary pad 112 may be provided in a region corresponding to the first connection line 113. In this case, the at least one first secondary pad 112 may be provided in a region where one first connection line 113 is provided. For example, when two or more first secondary pads 112 are provided in a region where one first connection line 113 is provided, repair may be performed by using a first secondary pad 112, disposed at a position close to a routing line 710 where an error occurs, of the two or more first secondary pads 112. In this case, a length of the first connection line 113 between the first secondary pad 112 and the first pad 101 connected to the routing line 710 where an error occurs may be reduced, and thus, a resistance of the first connection line 113 may decrease. In FIGS. 3 and 5, the first substrate 100 including the one first secondary pad 112 provided in a region where the one first connection line 113 is provided is illustrated as an example of the present disclosure.

Moreover, in the first substrate 100 illustrated in FIGS. 3 and 5, the first secondary pad 112 may be provided at one end of the first connection line 113 to overlap the first connection line 113.

When one first secondary pad 112 is provided in a region where the first connection line 113 is provided, the first secondary pad 112 may be disposed at various positions, but as illustrated in FIG. 5, the first secondary pad 112 may be provided in a region corresponding to the one end of the first connection line 113.

However, the first secondary pad 112 may be disposed at a center portion instead of the one end of the first connection line 113.

For example, in a case where the first pad 101 provided at the other end of the first connection line 113 should be connected to the first secondary pad 112 provided at one side of the first connection line 113, a length of the first connection line 113 may be maximized or increased. In this case, due to a load caused by a resistance in the first connection line 113, the strength of a signal transferred through the first connection line 113 may decrease, or a signal transfer speed may be reduced.

In order to solve such a problem, the first secondary pad 112 may be provided at a center portion instead of the one end of the first connection line 113. Therefore, a length between the first secondary pad 112 and the first pad 101 connected through the first connection line 113 may not be greater than ½ of a length of the first connection line 113. Accordingly, a delay of a signal by the first connection line 113 may be prevented.

The first connection line 113 may be insulated from the first pads 101 and the at least one first secondary pad 112.

In the second substrate 600, a second pad portion 610 adjacent to the 2-1$^{th}$ lateral surface may include second pads 601 connected to the routing lines 710, at least one second secondary pad 612 provided between the second pads 601, and at least one second connection line 613 provided to overlap the second pads 601 and the at least one second secondary pad 612.

For example, in the second substrate 600 illustrated in FIG. 4, two second connection lines 613 may be provided, and the second secondary pad 612 may be provided at a first lateral end of each of the two second connection lines 613 to overlap the second connection line 613.

The number of second connection lines 613 may be variously set based on a size of the second substrate 600, the number of signal lines 190, and a defect rate of the routing lines 710, and moreover, may be set to be equal to the number of first connection lines 613.

The second secondary pad 612 may be provided in a region corresponding to the second connection line 613. In this case, the at least one second secondary pad 612 may be provided in a region where one second connection line 613 is provided. For example, when two or more second secondary pads 612 are provided in a region where one second connection line 613 is provided, repair may be performed by using a second secondary pad 612, disposed at a position close to a routing line 710 where an error occurs, of the two or more second secondary pads 612. In this case, a length of the second connection line 613 between the second secondary pad 612 and the second pad 601 connected to the routing line 710 where an error occurs may be reduced, and thus, a resistance of the second connection line 613 may decrease. In FIG. 4, the second substrate 600 including the one second secondary pad 612 provided in a region where the one second connection line 613 is provided is illustrated as an example of the present disclosure.

That is, in a case where one second secondary pad 612 is provided in a region where the second connection line 613 is provided, the second secondary pad 612 may be disposed at various positions, but as illustrated in FIG. 4, the second secondary pad 612 may be provided in a region corresponding to the one end of the second connection line 613.

However, like the first secondary pad 112, the second secondary pad 612 may be disposed at a center portion instead of the one end of the second connection line 613.

The second connection line 613 may be insulated from the second pads 601 and the at least one second secondary pad 612.

In this case, the second connection line 613 may be provided in a region corresponding to the first connection line 113, and the second secondary pad 612 may be provided in a region corresponding to the first secondary pad 112.

That is, the first secondary pad 112 and the second secondary pad 612 may be provided to be paired, and particularly, may be provided at positions facing each other in the light emitting display apparatus.

The first pads 101 and the second pads 601 may be provided to be paired, and particularly, may be provided at positions facing each other in the light emitting display apparatus.

The routing portion 700 may include at least one secondary routing line 720 connecting at least one first secondary pad 112 to at least one second secondary pad 612. In FIGS.

3 and 4, a light emitting display apparatus where two secondary routing lines 720 are provided is illustrated as an example of the present disclosure. That is, lines except two secondary routing line 720 among lines provided in the 1-1$^{th}$ lateral surface and the 2-1$^{th}$ lateral surface of the light emitting display apparatus illustrated in FIGS. 3 and 4 may be routing lines 710.

The secondary routing line 720 may be formed in the same shape as that of the routing line 710.

Finally, as illustrated in FIG. 4, a link line portion 690 including link lines 640 connected to the second pads 601 may be provided in the second substrate 600.

At least one drivers may be connected to the link lines 640.

Some of the link lines may be connected to a data driver 300, some of the link lines may be connected to a controller 400, and some of the link lines may be connected to a power supply 500.

For example, in FIG. 4, as an example of the present disclosure, a light emitting display apparatus is illustrated where the link lines 640 are connected to the data driver 300 through a first printed circuit board (PCB) 301 equipped with the data driver 300 and the first PCB 301 is connected to a second PCB 410 equipped with the controller 400.

In this case, the power supply 500 may be mounted on the second PCB 410.

Moreover, link lines 640 connected to the controller 400 and the power supply 500 among the link lines 640 may be connected to the controller 400 and the power supply 500 through the first PCB 301 and the second PCB 410.

To this end, lines connected to the link lines 640 may be provided in the first PCB 301 and the second PCB 410.

The second secondary pads 112 may not be connected to the link lines 640.

That is, the second secondary pad 112 may be connected to the secondary routing line 720 and may not be connected to the link line 640.

Hereinafter, a structure (particularly, a structure of a first substrate 100) of a light emitting display apparatus according to the present disclosure including elements described above will be described with reference to FIGS. 1 to 5.

As described above, the light emitting display apparatus according to the present disclosure may include a first substrate 100, including pixels 109 and signal lines 190 arranged in a first direction, and a second substrate 600 which is disposed on a rear surface of the first substrate 100.

The signal lines 190 and the pixels 109 may be included in the first substrate 100. The signal lines 190 may include data lines DL1 to DLd which transfer data voltages to the pixels 109, power lines which transfer driving voltages to the pixels 109, gate clock lines which transfer gate clocks to a gate driver 200, and gate power lines which transfer gate driving voltages to the gate driver 200. Hereinafter, for convenience of description, as an example of the present disclosure, a light emitting display apparatus where the signal lines 190 are data lines will be described.

That is, as illustrated in FIGS. 3 and 5, the pixels 109 may be provided in the first substrate 100, and the data lines DL connected to first pads 101 may be provided in the first substrate 100.

The first pads 101 may be included in a first pad portion 110, and in addition to the first pads 101, at least one first secondary pad 112 and at least one first connection line 113 may be provided in the first pad portion 110.

The gate driver 200 may include stages, for sequentially outputting gate pulses.

Each of the stages may include a plurality of stage transistors.

In this case, the stage transistors may be provided in a display area 120 of the first substrate.

For example, as illustrated in FIG. 5, an m$^{th}$ stage Stage m may include a plurality of m$^{th}$ branch circuit units BCm (or "m$^{th}$ branch circuits BCm"), and each of the m$^{th}$ branch circuit units BCm may include at least one stage transistor included in the m$^{th}$ stage Stage m. However, when the number of stage transistors included in the m$^{th}$ stage Stage m is less than the number of m$^{th}$ branch circuit units BCm, a stage transistor may not be included in at least one m$^{th}$ branch circuit unit BCm.

The m$^{th}$ branch circuit units BCm, as illustrated in FIG. 5, may be provided between unit pixels 109a configured with four pixels 10.

That is, the unit pixels 109a may be provided along a gate line GL arranged in a direction which differs from the data lines DL1 to DLd, and thus, the m$^{th}$ branch circuit units BCm may also be provided along the gate line GL.

In this case, a stage line portion including stage lines connected to the m$^{th}$ branch circuit units BCm may be provided along the gate line GL.

Moreover, gate clock lines which are connected to all stages and transfer gate clocks to all stages and gate power lines which transfer gate driving voltages to the gate driver 200 may be arranged in parallel with the data lines DL1 to DLd. The gate clock lines and the gate power lines may be connected to the first pads 101. In this case, the gate clock lines and the gate power lines may be included in the signal lines 190.

That is, in the light emitting display apparatus according to the present disclosure, the gate driver 200 may be provided in the display area 120 of the first substrate 100, and various lines described above may be the signal lines 190.

In this case, the signal lines 190 may be connected to the first pads 101 included in the first pad portion 110 of the first substrate 100.

The first pads 101 may be connected to second pads 601 included in a second pad portion 610 of the second substrate 600 through the routing lines 710 provided at a 1-1$^{th}$ lateral surface of the first substrate 100 and a 2-1$^{th}$ lateral surface of the second substrate 600.

The link lines 640 connected to the second pads 601 may be connected to the data driver 300, the controller 400, and the power supply 500, which are provided on a rear surface of the second substrate 600.

The first secondary pad 112 may be connected to the second secondary pad 612 through the secondary routing line 720 provided in each of the 1-1$^{th}$ lateral surface of the first substrate 100 and the 2-1$^{th}$ lateral surface of the second substrate 600.

In a case where the first secondary pad 112 is not connected to the first connection line 113, the first secondary pad 112 may not be connected to the signal line 190.

In a case where the second secondary pad 612 is not connected to the second connection line 613, the second secondary pad 612 may not be connected to the link line 640.

Hereinafter, a light emitting display apparatus according to the present disclosure before and after repair will be described with reference to FIGS. 6 to 10. In the following description, details which are the same or similar to details described above with reference to FIGS. 1 to 5 are omitted or will be briefly described.

Figure 6A:
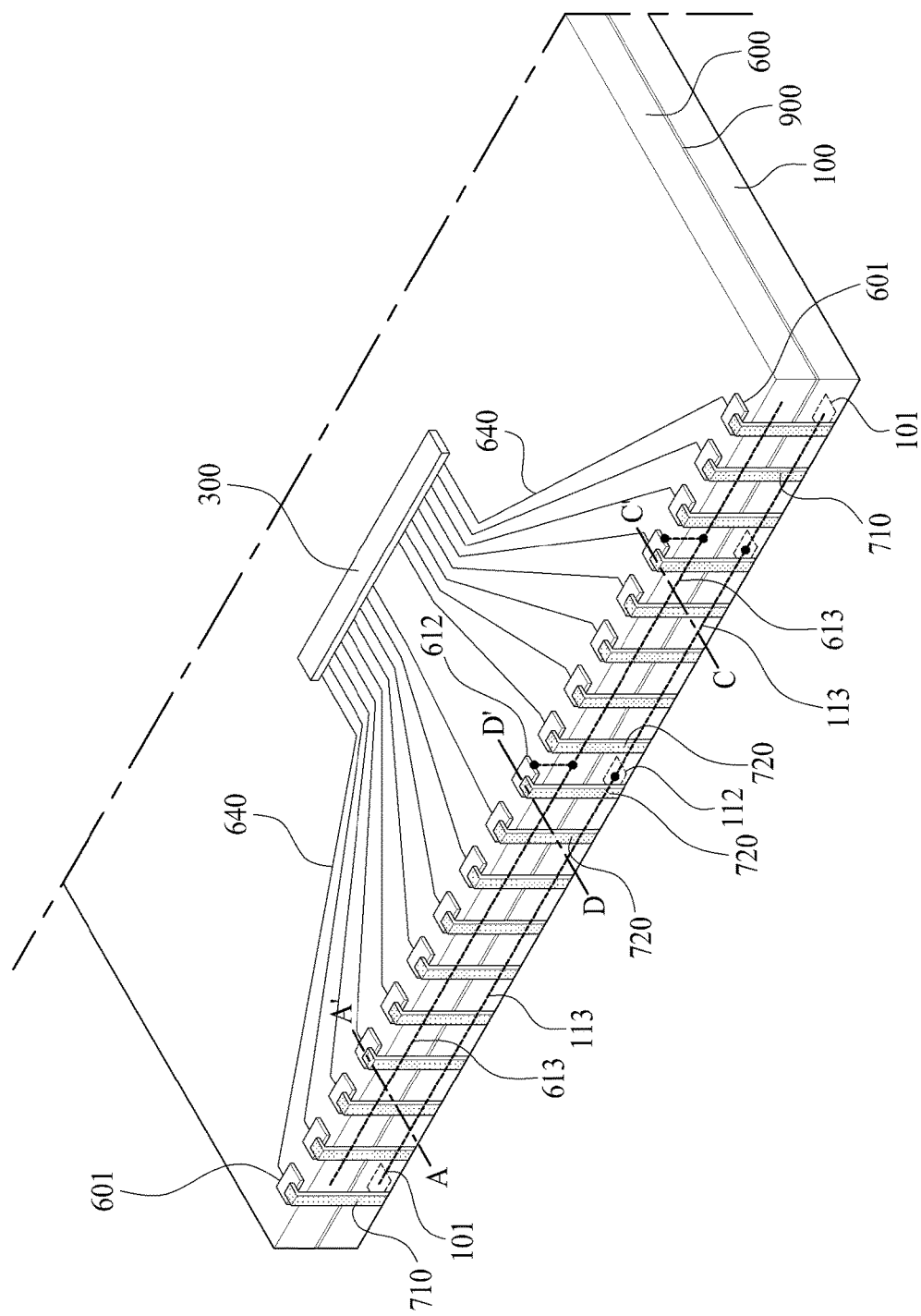
FIGS. 6A and 6B are example diagrams schematically illustrating a rear surface of a light emitting display apparatus according to the present disclosure.
Figure 6B:
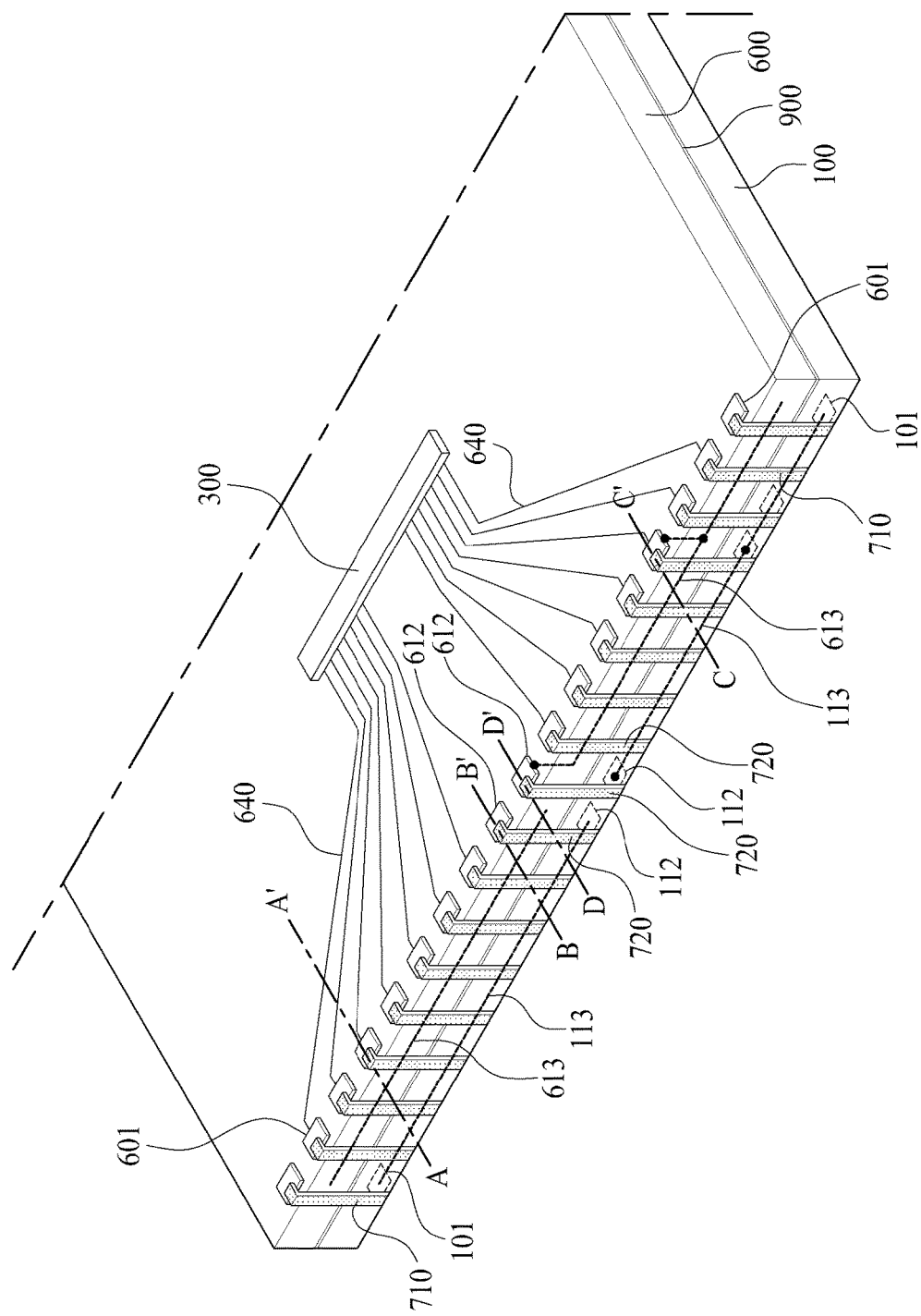
Figure 7:
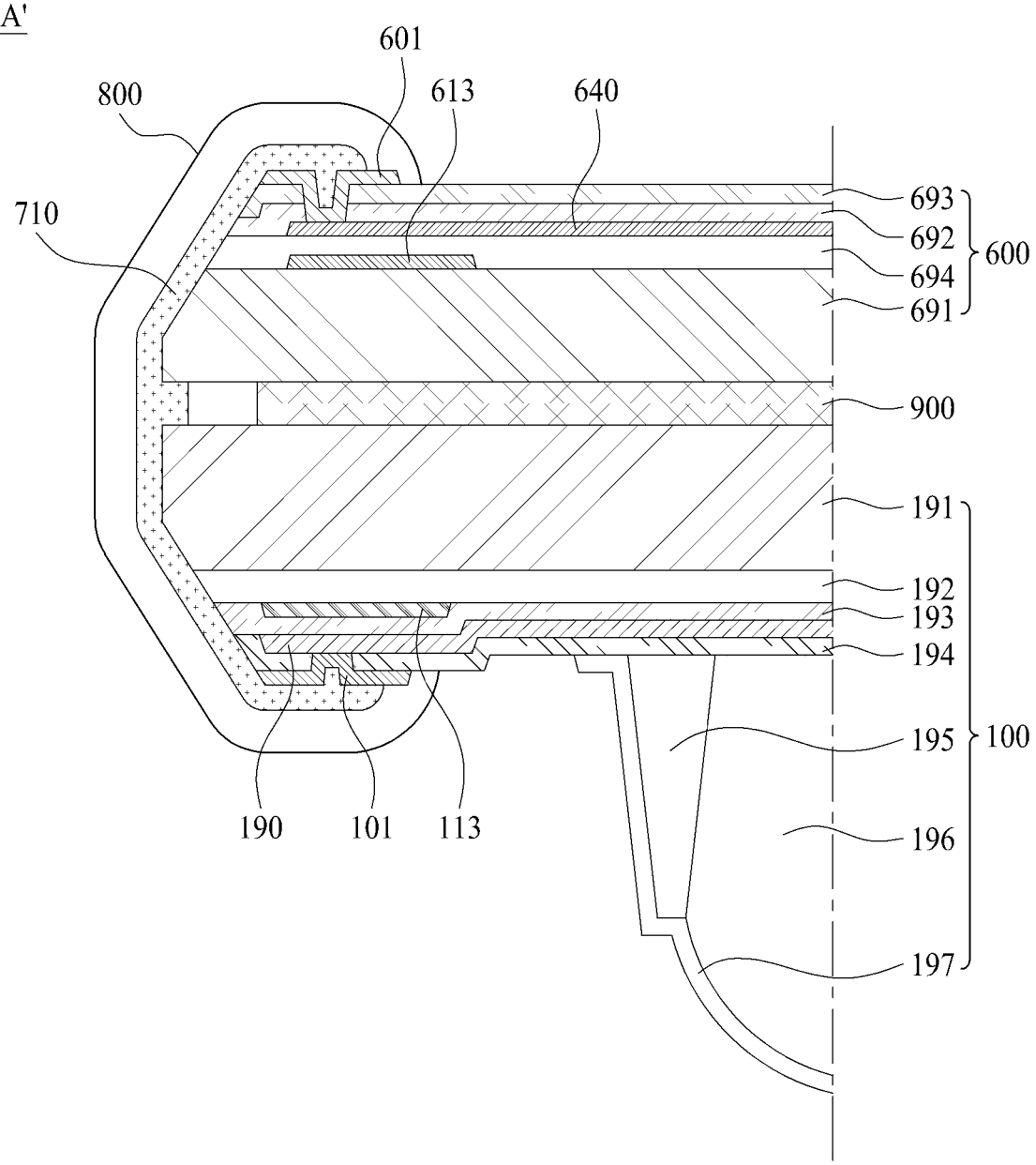
FIG. 7 is an example diagram illustrating a cross-sectional surface taken along line A-A' illustrated in FIGS. 6A and 6B.
Figure 8:
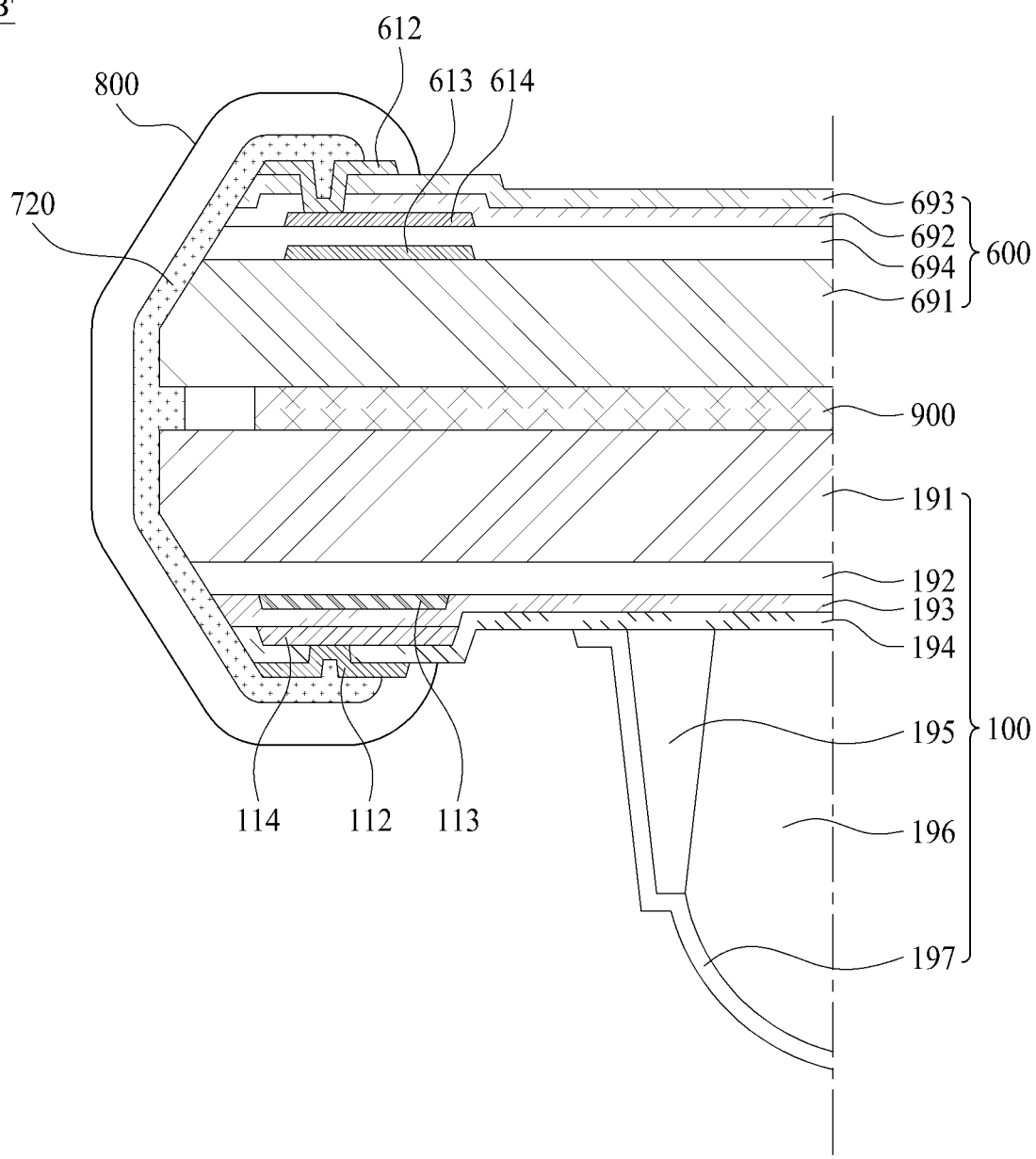
FIG. 8 is an example diagram illustrating a cross-sectional surface taken along line B-B' illustrated in FIG. 6B.
Figure 9:
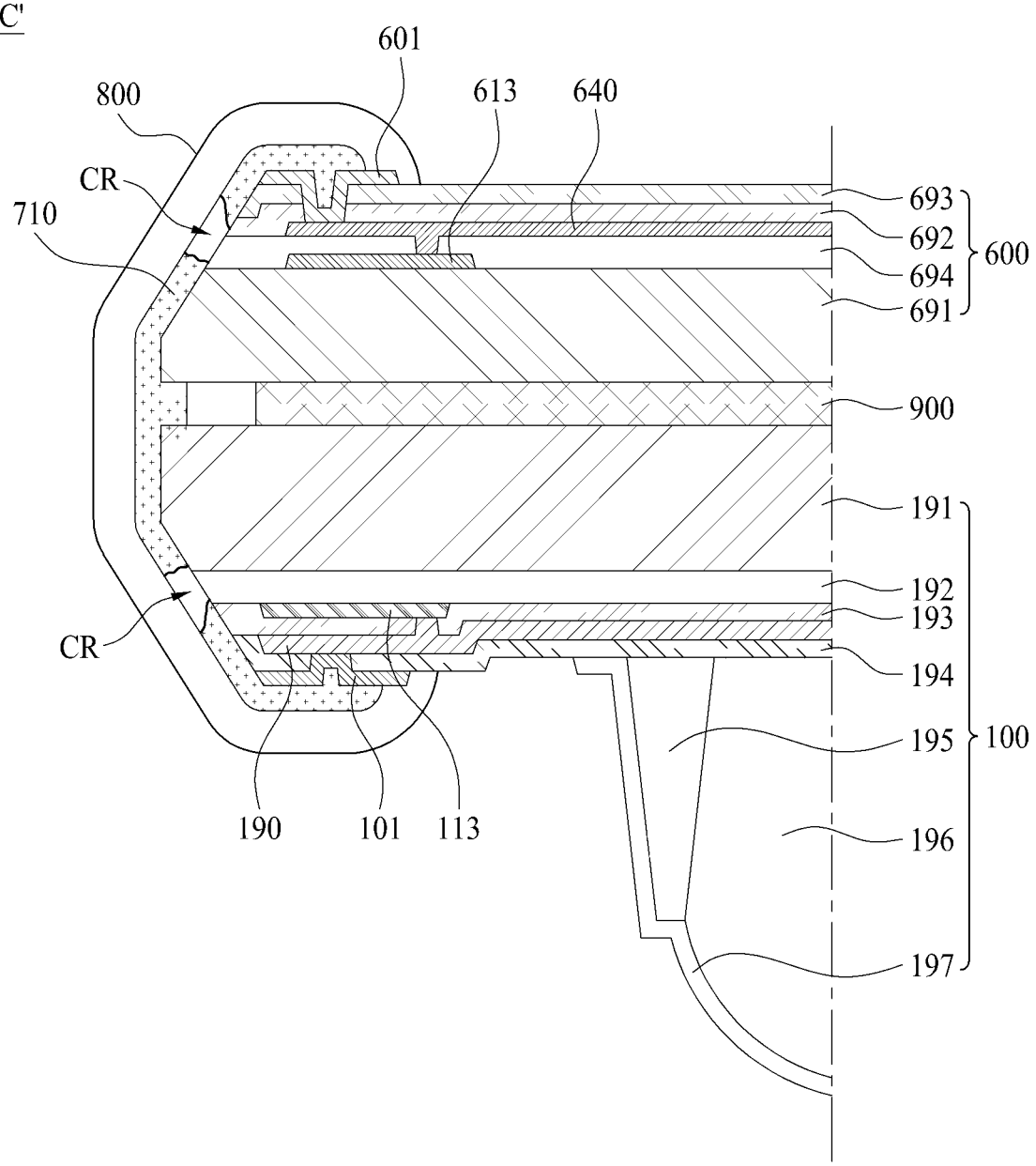
FIG. 9 is an example diagram illustrating a cross-sectional surface taken along line C-C' illustrated in FIGS. 6A and 6B.
Figure 10:
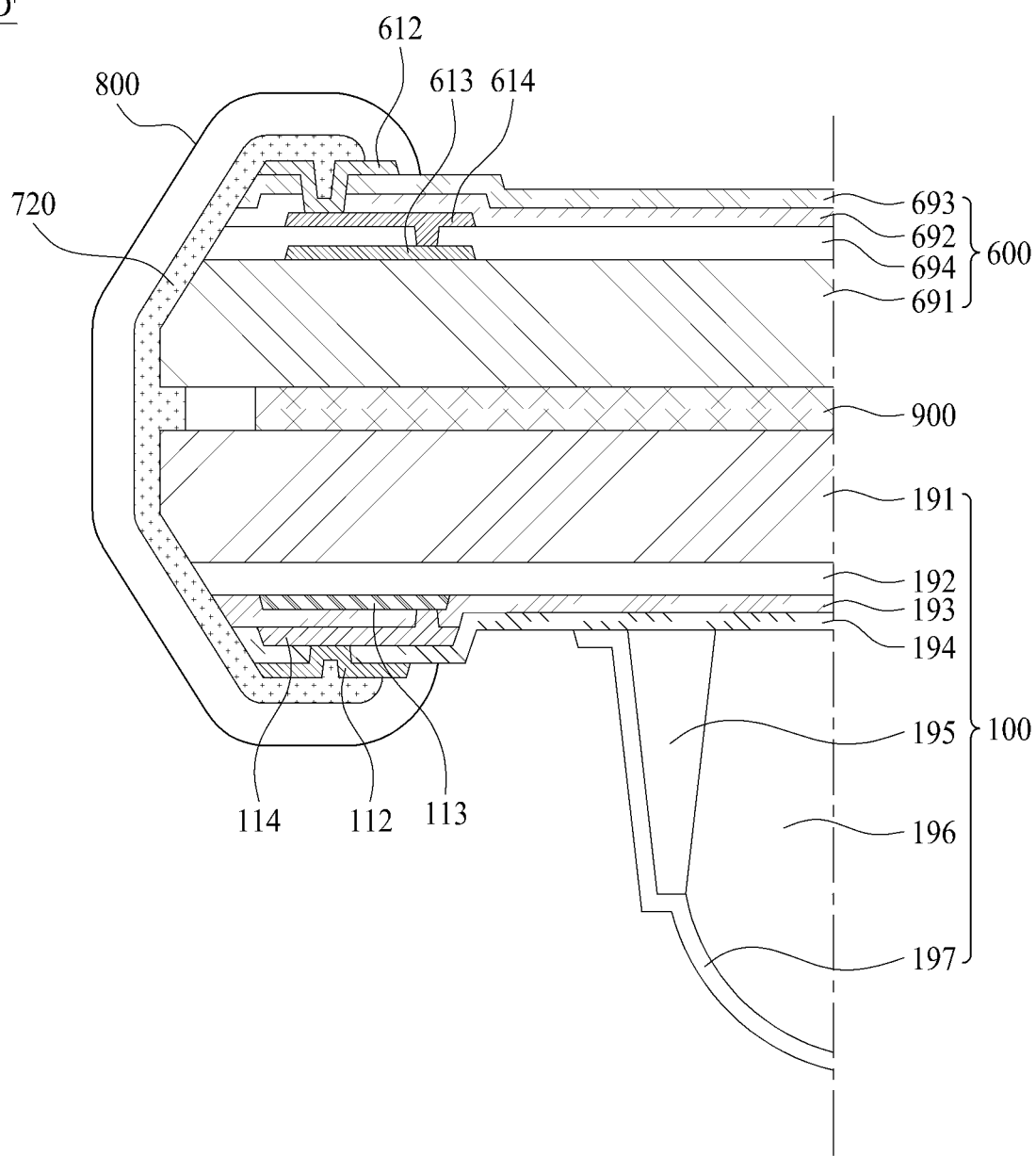
FIG. 10 is an example diagram illustrating a cross-sectional surface taken along line D-D' illustrated in FIGS. 6A and 6B.

FIGS. 6A and 6B are example diagrams schematically illustrating a rear surface of a light emitting display apparatus according to the present disclosure, FIG. 7 is an example diagram illustrating a cross-sectional surface taken along line A-A' illustrated in FIGS. 6A and 6B, FIG. 8 is an example diagram illustrating a cross-sectional surface taken along line B-B' illustrated in FIG. 6B, FIG. 9 is an example diagram illustrating a cross-sectional surface taken along line C-C' illustrated in FIGS. 6A and 6B, and FIG. 10 is an example diagram illustrating a cross-sectional surface taken along line D-D' illustrated in FIGS. 6A and 6B.

Particularly, for convenience of description, a light emitting display apparatus where the number of routing lines 710 and secondary routing lines 720 provided in a lateral surface is 18 is illustrated in FIGS. 6A and 6B as an example of the present disclosure. However, the number of routing lines 710 and secondary routing lines 720 may be variously set based on a size of a light emitting display apparatus.

Moreover, a light emitting display apparatus including one first connection line 113 and one second connection line 613 is illustrated in FIG. 6A as an example of the present disclosure, and a light emitting display apparatus including two first connection lines 113 and two second connection lines 613 is illustrated in FIG. 6B as an example of the present disclosure. However, the number of first connection lines 113 and second connection lines 613 may be variously set based on a size of a light emitting display apparatus.

Moreover, a repaired first connection line 113 is illustrated in FIG. 6A, and an unrepaired first connection line 113 and a repaired first connection line 113 are illustrated in FIG. 6B.

As described above, a first pad portion 110 may include first pads 101 which are connected to signal lines 190 and routing lines 710, a first secondary pad 112 which is provided between the first pads 101, and a first connection line 113 which is provided to overlap the first pad 101 and the first secondary pad 112. Also, a second pad portion 610 may include second pads 601 which are connected to the routing lines 710, a second secondary pad 612 which is provided between the second pads 601, and a second connection line 613 which is provided to overlap the second pad 601 and the second secondary pad 612.

When the routing lines 710 connected to the first pads 101 and the second pads 601 respectively overlapping the first connection line 113 and the second connection line 613 are normal, a repair process may not be performed on the first connection line 113 and the second connection line 613. In this case, the first connection line 113 may not be connected to the first pad 101 and the first secondary pad 112, and the second connection line 613 may not be connected to the second pad 601 and the second secondary pad 612. Also, the first secondary pad 112 may not be connected to the signal line 190, and the second secondary pad 612 may not be connected to the link line 640. Also, the first connection line 113 may be insulated from the first pads 101 and the first secondary pad 112, and the second connection line 613 may be insulated from the second pads 601 and the second secondary pad 612.

When a repair process is not performed on the first connection line 113 and the second connection line 613, a cross-sectional view between the first pad 101 and the second pad 601 is illustrated in FIG. 7, and when a repair process is not performed on the first connection line 113 and the second connection line 613, a cross-sectional view between the first secondary pad 113 and the second secondary pad 613 is illustrated in FIG. 8.

Moreover, when a repair process is performed on the first connection line 113 and the second connection line 613, a cross-sectional view between the first pad 101 and the second pad 601 is illustrated in FIG. 9, and when a repair process is performed on the first connection line 113 and the second connection line 613, a cross-sectional view between the first secondary pad 113 and the second secondary pad 613 is illustrated in FIG. 10.

First, referring to FIG. 7, when a repair process is not performed on the first connection line 113 and the second connection line 613, the first connection line 113 may be insulated from the first pads 101, and the second connection line 613 may be insulated from the second pads 601.

For example, as illustrated in FIG. 7, the first connection line 113 may overlap the first pads 101 with an insulation layer 193 therebetween, and the second connection line 613 may overlap the second pads 601 with a first layer 692 therebetween.

To provide an additional description, in FIG. 7, a first substrate 100 may include a first base substrate 191, a buffer 192, an insulation layer 193, a first passivation layer 194, a dam 195, a second passivation layer 196, and an encapsulation layer 197. For example, various electrodes may be disposed between the buffer 192, the insulation layer 193, and the first passivation layer 194. Therefore, the various transistors configuring the pixel driving circuit PDC described above with reference to FIG. 2 and the stage transistors described above with reference to FIG. 9 may be provided. A light emitting device ED may be provided on the first passivation layer 194 and may be protected by the second passivation layer 196, and finally, the encapsulation layer 197 may be provided on the second passivation layer 196. Also, the dam 195 for supporting the second passivation layer 196 may be provided at an end of a display area 120.

In this case, a first connection line 113 may be provided between the buffer 192 and the insulation layer 193, signal lines 190 may be provided between the insulation layer 193 and the first passivation layer 194, and first pads 101 may be provided on the first passivation layer 194.

Therefore, the first connection line 113 may overlap the first pads 101 with the insulation layer 193 therebetween.

However, the first substrate 100 may be formed in various structures in addition to a structure illustrated in FIG. 7.

Moreover, in FIG. 7, a second substrate 600 may include a second base substrate 691, a connection line protection layer 694, a first layer 692, and a second layer 693.

For example, a second connection line 613 may be provided between the second base substrate 691 and the connection line protection layer 694, and a link line 640 may be provided between the connection line protection layer 694 and the first layer 292.

The second pads 601 may be provided on one of the first layer 692 and the second layer 693.

In this case, as illustrated in FIG. 7, the routing lines 710 may be protected by a coating layer 800.

That is, when a repair process is not performed on the first connection line 113 and the second connection line 613, the first connection line 113 may be insulated from the first pads 101, the second connection line 613 may be insulated from the second pads 601, and the first pads 101 may be connected to the second pads 601 through the routing line 710.

Therefore, a signal transferred through the link line 640 may be transferred to the first pad 101 through the second pad 601 and the routing line 710, and the signal transferred to the first pad 101 may be transferred to a pixel 109 through the signal line 190.

Second referring to FIG. 8, when a repair process is not performed on the first connection line 113 and the second connection line 613, the first connection line 113 may be insulated from the first secondary pads 112, and the second connection line 613 may be insulated from the second secondary pads 612.

For example, as illustrated in FIG. 8, the first connection line 113 may overlap the first secondary pads 112 with the insulation layer 193 therebetween, and the second connection line 613 may overlap the second secondary pads 612 with the connection line protection layer 694 therebetween.

To provide an additional description, in FIG. 8, a first substrate 100 may include a first base substrate 191, a buffer 192, an insulation layer 193, a first passivation layer 194, a dam 195, a second passivation layer 196, and an encapsulation layer 197. The first base substrate 191, the buffer 192, the insulation layer 193, the first passivation layer 194, the dam 195, the second passivation layer 196, and the encapsulation layer 197 illustrated in FIG. 8 may be the same as the first base substrate 191, the buffer 192, the insulation layer 193, the first passivation layer 194, the dam 195, the second passivation layer 196, and the encapsulation layer 197 illustrated in FIG. 7.

The first connection line 113 may be provided between the buffer 192 and the insulation layer 193, and the first secondary pads 112 may be provided on the first passivation layer 194.

In this case, a first secondary pad metal 114 may be provided between the insulation layer 193 and the first passivation layer 194. That is, the first secondary pad metal 114 may be formed on the same layer as the signal lines 190.

The first secondary pad metal 114 may be connected to the first secondary pad 112 to overlap the first connection line 113 and may be used to connect the first connection line 113 to the first secondary pad 112.

Therefore, the first connection line 113 may overlap the first secondary pad 112 with the insulation layer 193 therebetween.

However, the first substrate 100 may be formed in various structures in addition to a structure illustrated in FIG. 8.

Moreover, in FIG. 8, a second substrate 600 may include a second base substrate 691, a connection line protection layer 694, a first layer 692, and a second layer 693.

For example, a second connection line 613 may be provided between the second base substrate 691 and the connection line protection layer 694, and a second secondary pad metal 614 may be provided between the connection line protection layer 694 and the first layer 292. That is, the second secondary pad metal 614 may be formed on the same layer as the link lines 640.

The second secondary pad metal 614 may be connected to the first secondary pad 612 to overlap the second connection line 613 and may be used to connect the second connection line 613 to the second secondary pad 612.

The second secondary pads 612 may be provided on one of the first layer 692 and the second layer 693.

In this case, as illustrated in FIG. 8, secondary routing lines 720 may be protected by a coating layer 800.

That is, when a repair process is not performed on the first connection line 113 and the second connection line 613, the first connection line 113 may be insulated from the first secondary pads 112, the second connection line 613 may be insulated from the second secondary pads 612, and the first secondary pads 112 may be connected to the second secondary pads 612 through the secondary routing line 720.

Therefore, any signal may not be transferred between the second secondary pad 612 and the first secondary pad 112.

Third, as illustrated in FIG. 9, when the routing line 710 connecting the first pad 101 to the second pad 601 is opened, a repair process may be performed on first connection line 113 and second connection line 613. Here, the routing line 710 being opened may denote that the routing line 710 is disconnected, or may denote that the routing line 710 is damaged. When the routing line 710 is opened or the routing line 710 is damaged, a signal may not normally be transferred through the routing line 710.

When a repair process is performed on the first connection line 113 and the second connection line 613, the routing line 710 which is determined to be opened or damaged may be repaired to be completely opened. Accordingly, the repaired routing line 710 may not be connected to the signal line 190 connected to the first pad 101, and moreover, may not be connected to the link line 640 connected to the second pad 601. In FIG. 9, a disconnected portion of the routing line 710 is illustrated by reference numeral CR.

When a repair process is performed on the first connection line 113, the first pad 101 connected to an opened routing line 710 may be connected to the first connection line 113.

For example, in a repair process, a laser beam may be irradiated onto the signal line 190 overlapping the first connection line 113, and thus, as the signal line 190 is recessed, as illustrated in FIG. 9, the signal line 190 may be connected to the first connection line 113.

Moreover, in a repair process, a laser beam may be irradiated onto the signal line 190 and the first pad 101 overlapping the first connection line 113, and thus, as the first pad 101 and the signal line 190 are recessed, the signal line 190 may be connected to the first connection line 113.

That is, when a repair process is performed on the first connection line 113, the first connection line 113 may be connected to the signal line 190, and thus, the first connection line 113 may be connected to the first pad 101 connected to the signal line 190.

When a repair process is performed on the second connection line 613, the second pad 601 connected to an opened routing line 710 may be connected to the second connection line 613.

For example, in a repair process, a laser beam may be irradiated onto the link line 640 overlapping the second connection line 613, and thus, as the link line 640 is recessed, as illustrated in FIG. 9, the link line 640 may be connected to the second connection line 613.

Moreover, in a repair process, a laser beam may be irradiated onto the link line 640 and the second pad 601 overlapping the second connection line 613, and thus, as the second pad 601 and the link line 640 are recessed, the link line 640 may be connected to the second connection line 613.

That is, when a repair process is performed on the second connection line 613, the second connection line 613 may be connected to the link line 640, and thus, the second connection line 613 may be connected to the second pad 601 connected to the link line 640.

That is, when a repair process is performed on the first connection line 113 and the second connection line 613, the first connection line 113 may be connected to the first pad 101 and the signal line 190 connected to the first pad 101, and the second connection line 613 may be connected to the second pad 601 and the link line 640 connected to the second pad 601. In this case, the first pad 101 on which a repair process has been performed may not be connected to the second pad 601, on which a repair process has been performed, through the routing line 710.

Therefore, a signal transferred through the link line 640 may be transferred to the first pad 101 through the second pad 601 and the routing line 710, and the signal transferred through the link line 640 may be transferred to the second secondary pad 612 through the second connection line 613.

In this case, the second pad 601 may be electrically connected to the second connection line 613, or may not be connected to the second connection line 613.

Moreover, the first pad 101 may be electrically connected to the first connection line 113, or may not be connected to the first connection line 113.

Fourth, as illustrated in FIG. 10, when the routing line 710 connecting the first pad 101 to the second pad 601 is opened, a repair process may be performed on the first secondary pad 112 and the second secondary pad 612.

When a repair process is performed on the first connection line 113, the first secondary pad 112 may be connected to the first connection line 113.

For example, in a repair process, a laser beam may be irradiated onto the first secondary pad metal 114 overlapping the first connection line 113, and thus, as the first secondary pad metal 114 is recessed, as illustrated in FIG. 10, the first secondary pad metal 114 may be connected to the first connection line 113. Accordingly, the first secondary pad 112 connected to the first secondary pad metal 114 may be connected to the first connection line 113.

Moreover, in a repair process, a laser beam may be irradiated onto the first secondary pad 112 overlapping the first connection line 113, and thus, as the first secondary pad 112 is recessed, the first secondary pad 112 may be connected to the first connection line 113.

Moreover, in a repair process, a laser beam may be irradiated onto the first secondary pad 112 and the first secondary pad metal 114 overlapping the first connection line 113, and thus, as the first secondary pad 112 and the first secondary pad metal 114 are recessed, the first secondary pad 112 and the first secondary pad metal 114 may be connected to the first connection line 113.

That is, when a repair process is performed on the first connection line 113, the first connection line 113 may be connected to the first secondary pad 112.

When a repair process is performed on the second connection line 613, the second connection line 613 may be connected to the second secondary pad 612.

For example, in a repair process, a laser beam may be irradiated onto the second secondary pad metal 614 overlapping the second connection line 613, and thus, as the second secondary pad metal 614 is recessed, as illustrated in FIG. 10, the second secondary pad metal 614 may be connected to the second connection line 613. Accordingly, the second secondary pad 612 connected to the second secondary pad metal 614 may be connected to the second connection line 613.

Moreover, in a repair process, a laser beam may be irradiated onto the second secondary pad 612 overlapping the second connection line 613, and thus, as the second secondary pad 612 is recessed, the second secondary pad 612 may be connected to the second connection line 613.

Moreover, in a repair process, a laser beam may be irradiated onto the second secondary pad 612 and the second secondary pad metal 614 overlapping the second connection line 613, and thus, as the second secondary pad 612 and the second secondary pad metal 614 are recessed, the second secondary pad 612 and the second secondary pad metal 614 may be connected to the second connection line 613.

That is, when a repair process is performed on the second connection line 113, the second connection line 613 may be connected to the second secondary pad 612. In this case, the first secondary pad 112 may be connected to the second secondary pad 612 through a secondary routing line 720.

Therefore, when a repair process is performed on the first connection line 113 and the second connection line 613, a signal transferred through the link line 640 may be transferred to the first secondary pad 112 through the second connection line 613, the second secondary pad 612, and the secondary routing line 720, and a signal transferred to the first secondary pad 112 may be transferred to a pixel 109 through the first connection line 113 and the signal line 190.

That is, according to the present disclosure described above, even when the routing line 710 is damaged, a signal supplied through the link line 640 may be transferred to the pixel 109 through the second connection line 613, the second secondary pad 612, the secondary routing line 720, the first secondary pad 112, the first connection line 113, and the signal line 190.

Accordingly, according to the present disclosure, even when the routing line 710 is damaged, the light emitting display apparatus may be normally driven, and thus, a yield rate of light emitting display apparatuses may be enhanced.

According to the present disclosure, when a routing line is damaged, a signal line connected to the damaged routing line may be connected to a secondary routing line through a secondary pad. Accordingly, even when the routing line is damaged, a signal may be normally supplied to the signal line, and thus, a defect rate of a light emitting display apparatus may be reduced.

That is, in a routing process performed at a latter part of a process of manufacturing a light emitting display apparatus, even when an error occurs due to the routing line, the light emitting display apparatus may be repaired in a normal state, and thus, a defect rate of the light emitting display apparatus may be reduced.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:
   a first substrate including a plurality of pixels and a plurality of signal lines, the plurality of pixels and the plurality of signal lines being arranged in a first direction; and
   a second substrate disposed on a rear surface of the first substrate,
   wherein a routing portion including a plurality of routing lines is provided in a first lateral surface of the first substrate and a second lateral surface of the second substrate,
   in the first substrate, a first pad portion adjacent to the first lateral surface includes a plurality of first pads connected to the plurality of signal lines and the plurality of routing lines, a first secondary pad provided between the plurality of first pads, and a first connection line provided to overlap the plurality of first pads and the first secondary pad,
   in the second substrate, a second pad portion adjacent to the second lateral surface includes a plurality of second pads connected to the plurality of routing lines, a second secondary pad provided between the plurality of second pads, and a second connection line provided to overlap the plurality of second pads and the second secondary pad,
   a first base substrate of the first substrate and a second base substrate of the second substrate are positioned between the first connection line and the second connection line, and
   the routing portion includes a secondary routing line connecting the first secondary pad to the second secondary pad.

2. The light emitting display apparatus of claim 1, wherein the plurality of signal lines comprises:
   a plurality of data lines transferring data voltages to the plurality of pixels; and
   a plurality of power lines transferring driving voltages to the plurality of pixels.

3. The light emitting display apparatus of claim 2, further comprising a gate driver including a plurality of stage transistors arranged along a plurality of gate lines connected to the plurality of pixels, the gate driver being provided in the first substrate.

4. The light emitting display apparatus of claim 3, wherein the plurality of signal lines further comprises:
   a plurality of gate clock lines transferring a plurality of gate clocks to the gate driver; and
   a plurality of gate power lines transferring a plurality of gate driving voltages to the gate driver.

5. The light emitting display apparatus of claim 1, wherein the first connection line is insulated from the plurality of first pads and the first secondary pad, and
   the second connection line is insulated from the plurality of second pads and the second secondary pad.

6. The light emitting display apparatus of claim 1, further comprising a plurality of link lines connected to the second pads, the plurality of link lines being provided in the second substrate, at least one of the plurality of drivers being connected to the plurality of link lines.

7. The light emitting display apparatus of claim 1, wherein the first secondary pad is provided at a center of the first connection line.

8. The light emitting display apparatus of claim 1, wherein the first connection line is connected to the first secondary pad and one of the plurality of signal lines, and
   the second connection line is connected to the second secondary pad and one of a plurality of link lines provided in the second substrate.

9. The light emitting display apparatus of claim 8, wherein one of the plurality of routing lines is opened, or is not connected to a signal line connected to the first pad or is not connected to a link line connected to the second pad.

10. The light emitting display apparatus of claim 8, wherein the first secondary pad is connected to the second secondary pad through the secondary routing line.

11. The light emitting display apparatus of claim 10, wherein one of the plurality of link lines provided in the second substrate and connected to the plurality of second pads is connected to the secondary routing line.

12. The light emitting display apparatus of claim 1, wherein the first secondary pad is connected to a first secondary pad metal,
   the first secondary pad metal overlaps the first connection line,
   the second secondary pad is connected to a second secondary pad metal, and
   the second secondary pad metal overlaps the second connection line.

13. The light emitting display apparatus of claim 12, wherein the first secondary pad metal is provided on a same layer as the plurality of signal lines, and
   the second secondary pad metal is provided on a same layer as a link line provided in the second substrate and connected to the second pads.

14. The light emitting display apparatus of claim 12, wherein the first secondary pad metal is connected to the first connection line, and
   the second secondary pad metal is connected to the second connection line.

* * * * *